(12) United States Patent
Jeon et al.

(10) Patent No.: US 7,936,409 B2
(45) Date of Patent: May 3, 2011

(54) LIQUID CRYSTAL DISPLAY DEVICE AND FABRICATION METHOD THEREOF

(75) Inventors: Jin-Chae Jeon, Seoul (KR); Kyo-Ho Moon, Daegu (KR)

(73) Assignee: LG Display Co., Ltd., Seoul (KR)

( * ) Notice: Subject to any disclaimer, the term of this patent is extended or adjusted under 35 U.S.C. 154(b) by 358 days.

(21) Appl. No.: 12/292,095

(22) Filed: Nov. 12, 2008

(65) Prior Publication Data

US 2009/0121234 A1 May 14, 2009

(30) Foreign Application Priority Data

Nov. 14, 2007 (KR) .................. 10-2007-0116196

(51) Int. Cl.
G02F 1/136 (2006.01)

(52) U.S. Cl. .......................... 349/43; 349/42

(58) Field of Classification Search .............. 349/42–43; 257/59, 72
See application file for complete search history.

(56) References Cited

U.S. PATENT DOCUMENTS

| 6,780,784 | B2 | 8/2004 | Jo et al. ............ 438/745 |
| 7,248,323 | B2 | 7/2007 | Ahn et al. .......... 349/141 |
| 7,649,581 | B2 | 1/2010 | Choi et al. ........... 349/43 |
| 2007/0263166 | A1 | 11/2007 | Ahn et al. ........... 349/187 |

FOREIGN PATENT DOCUMENTS

| CN | 1727976 | 2/2006 |
| CN | 1909248 | 2/2007 |
| DE | 101 62 576 A1 | 7/2002 |
| DE | 10 2004 015 276 A1 | 11/2004 |

*Primary Examiner* — David Nelms
*Assistant Examiner* — Phu Vu
(74) *Attorney, Agent, or Firm* — Morgan, Lewis & Bockius LLP

(57) ABSTRACT

A liquid crystal display device including a gate electrode and a gate line formed on a first substrate, a first insulating layer formed on the first substrate, an active pattern, an ohmic-contact layer, and a diffusion preventing layer formed on the gate electrode, a data line to cross source and drain electrodes and the gate line formed on the diffusion preventing layer to define a pixel area, a second insulating layer formed on the first substrate, a contact hole formed by removing a portion of the second insulating layer and exposing a portion of the drain electrode, a pixel electrode electrically connected with the drain electrode via the contact hole, and a second substrate attached with the first substrate in a facing manner, wherein the diffusion preventing layer comprises a metal tip protruded to the side of the source and drain electrodes.

17 Claims, 16 Drawing Sheets

FIG. 8

| POINT | EXPERIMENTAL EXAMPLES | COMPARATIVE EXAMPLES |
| --- | --- | --- |
| 1 | 4.1 | 5.5 |
| 2 | 3.9 | 5.3 |
| 3 | 4.3 | 5.2 |
| 4 | 2.8 | 5.3 |
| 5 | 4.2 | 5.4 |
| 6 | 3.4 | 4.8 |
| 7 | 3.7 | 5.1 |
| 8 | 3.6 | 4.7 |
| 9 | 3.5 | 4.4 |
| 10 | 3.5 | 5.1 |
| 11 | 3.1 | 4.7 |
| AVERAGE | 3.6 | 5.0 |

LIQUID CRYSTAL DISPLAY DEVICE AND FABRICATION METHOD THEREOF

The present invention claims the benefit of Korean Patent Application No. 10-2007-0116196 filed in Korea on Nov. 14, 2007, which is hereby incorporated by reference.

BACKGROUND OF THE INVENTION

1. Field of the Invention

The present invention relates to a liquid crystal display (LCD) and its fabrication method and, more particularly, to an LCD and its fabrication method capable of forming low-resistance data wirings and implementing fine channels.

2. Discussion of the Related Art

As the consumer's interest in information displays grows and the demand for portable (mobile) information devices increases, research and commercialization of light and thin flat panel displays ("FPD") also have increased. Among FPDs, the liquid crystal display ("LCD") is a device for displaying images by using optical anisotropy of liquid crystal. As LCD devices exhibit excellent resolution, color, and picture quality, LCD devices are widely used in notebook computers, desktop monitors, and the like.

The LCD includes a color filter substrate, an array substrate, and a liquid crystal layer formed between the color filter substrate and the array substrate. The structure of the LCD will now be described in detail with reference to FIG. 1.

FIG. 1 is an exploded perspective view showing a related art LCD. As shown in FIG. 1, the LCD includes a color filter substrate 5, an array substrate 10, and a liquid crystal layer 30 formed between the color filter substrate 5 and the array substrate 10. The color filter substrate 5 includes a color filter (C) including a plurality of sub-color filters 7 that implement red, green, and blue colors, a black matrix 6 for dividing the sub-color filters 7 and blocking light transmission through the liquid crystal layer 30, and a transparent common electrode 8 for applying voltage to the liquid crystal layer 30. The array substrate 10 includes gate lines 16 and data lines 17 which are arranged vertically and horizontally to define a plurality of pixel regions (P), TFTs, switching elements, formed at respective crossings of the gate lines 16 and the data lines 17, and pixel electrodes 18 formed on the pixel regions (P).

The color filter substrate 5 and the array substrate 10 face each other and are attached by a sealant (not shown) formed at an edge of an image display region to form a liquid crystal panel, and the attachment of the color filter substrates 5 and the array substrate 10 is made by an attachment key formed on the color filter substrate 5 or the array substrate 10.

In the fabricating process of the LCD, a plurality of masking processes (i.e., photographing processes) are performed to fabricate the array substrate including the TFTs. A method for reducing the number of masks is required to improve productivity.

FIGS. 2A to 2E are sectional views sequentially showing a fabrication process of the array substrate of the LCD in FIG. 1.

As shown in FIG. 2A, a gate electrode 21 made of a conductive material is formed by using a photolithography process (a first masking process) on a substrate 20.

Next, as shown in 2B, a first insulation film 15a, an amorphous silicon thin film, and an n+ amorphous silicon thin film are sequentially deposited on the entire surface of the substrate 20 with the gate electrode 21 formed thereon, and the amorphous silicon thin film and the n+ amorphous silicon thin film are selectively patterned by using the photolithography process (a second masking process) to form an active pattern 24 formed of the amorphous silicon thin film on the gate electrode 21. In this case, the n+ amorphous silicon thin film pattern 25, which has been patterned in the same form as the active pattern 24, is formed on the active pattern 24.

Thereafter, as shown in FIG. 2C, a conductive metal material is deposited on the entire surface of the array substrate 20 and then selectively patterned by using the photolithography process (a third masking process) to form a source electrode 22 and a drain electrode 23 at an upper portion of the active pattern 24. At this time, a certain portion of the n+ amorphous silicon thin film pattern formed on the active pattern 24 is removed through the third masking process to form an ohmic-contact layer 25' between the active pattern 24 and the source and drain electrodes 22 and 23.

Subsequently, as shown in FIG. 2D, a second insulation film 15b is deposited on the entire surface of the array substrate 20 with the source electrode 22 and the drain electrode 23 formed thereon, and a portion of the second insulation film 15b is removed through the photolithography process (a fourth masking process) to form a contact hole 40 exposing a portion of the drain electrode 23.

Finally, as shown in FIG. 2E, a transparent conductive metal material is deposited on the entire surface of the array substrate 20 and then selectively patterned by using the photolithography process (a fifth making process) to form a pixel electrode 18 electrically connected with the drain electrode 23 via the contact hole 40.

As mentioned above, in fabricating the array substrate including the TFTs, five photolithography processes are necessarily performed to pattern the gate electrode, the active pattern, the source and drain electrodes, the contact hole, and the pixel electrode. The photolithography process is a process of transferring a pattern formed on a mask onto the substrate on which a thin film is deposited to form a desired pattern. The photolithography process includes a plurality of processes such as a process of coating a photosensitive solution, an exposing process, a developing process, etc. The plurality of photolithography processes degrade production yield. In particular, because the masks designed for forming the pattern are quite expensive, as the number of masks applied for the processes increases, the fabrication cost of the LCD increases proportionally. Thus, a technique for fabricating the array substrate by performing the masking process four times by forming the active pattern and the source and drain electrodes through a single masking process by using a slit (diffraction) mask is desired.

However, the LCD having such a structure described above has the active pattern, the source and drain electrodes, and the data lines patterned by performing an etching process twice. The result is that an active tail protrusively remains near the lower portions of the source electrode, the drain electrode, and the data lines. The active tail is formed of the same pure amorphous silicon thin film as the active pattern, so the protruded active tail is exposed to light of the lower backlight, generating an optical current. The amorphous silicon thin film reacts slightly to the minute blinking of light from the backlight, and repeatedly becomes activated and deactivated, which causes a change in the optical current. The optical current component is coupled with a signal flowing at the neighbor pixel electrodes to distort movement of the liquid crystal positioned at the pixel electrodes. As a result, a wavy noise is generated such that a wavy fine line appears on a screen of the LCD.

SUMMARY OF THE INVENTION

Accordingly, the present invention is directed to a liquid crystal display device and fabrication method thereof that substantially obviates one or more of the problems due to limitations and disadvantages of the related art.

An object of the present invention is to provide a liquid crystal display and its fabrication method capable of fabricating an array substrate by performing a masking process four times.

Another object of the present invention is to provide of a liquid crystal display and its fabrication method capable of forming data wirings with a low-resistance conductive material.

Yet another object of the present invention is to provide a liquid crystal display and its fabrication method capable of implementing fine channels, even when low-resistance data wirings are formed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the liquid crystal display device and fabrication method thereof includes a liquid crystal display device including a gate electrode and a gate line formed on a first substrate, a first insulating layer formed on the first substrate, an active pattern, an ohmic-contact layer, and a diffusion preventing layer formed on the gate electrode, a data line to cross source and drain electrodes and the gate line formed on the diffusion preventing layer to define a pixel area, a second insulating layer formed on the first substrate, a contact hole formed by removing a portion of the second insulating layer and exposing a portion of the drain electrode, a pixel electrode electrically connected with the drain electrode via the contact hole, and a second substrate attached with the first substrate in a facing manner, wherein the diffusion preventing layer comprises a metal tip protruded to the side of the source and drain electrodes.

In another aspect, the liquid crystal display device and fabrication method thereof includes a method for fabricating a liquid crystal display comprising the steps of providing a first substrate, forming a gate electrode and a gate line on the first substrate, forming a first insulating layer on the first substrate, forming an active pattern, an ohmic-contact layer, and a diffusion preventing layer at an upper portion of the gate electrode using dry etching, forming source and drain electrodes on the diffusion preventing layer using a wet etching, forming a second insulating layer on the first substrate, forming a contact hole by removing a portion of the second insulating layer and exposing a portion of the drain electrode, forming a pixel electrode electrically connected with the drain electrode via the contact hole, and attaching the first and second substrates, wherein the diffusion preventing layer includes a metal tip that protrudes beyond the source and drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 8 is a table showing data obtained measured by lengths of channels of a thin film transistor formed through the second masking process according to the second exemplary embodiment of the present invention and that formed through a general four-masking process.

DETAILED DESCRIPTION OF THE PREFERRED EMBODIMENTS

The liquid crystal display (LCD) and its fabrication method will now be described in detail with reference to the accompanying drawings.

Figure 1:
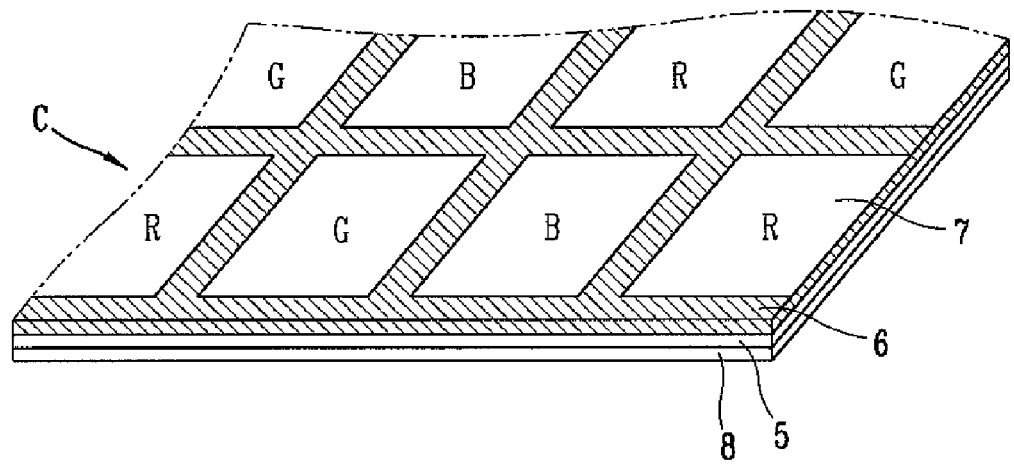
FIG. 1 is an exploded perspective view showing a related art liquid crystal display (LCD)
Figure 1:
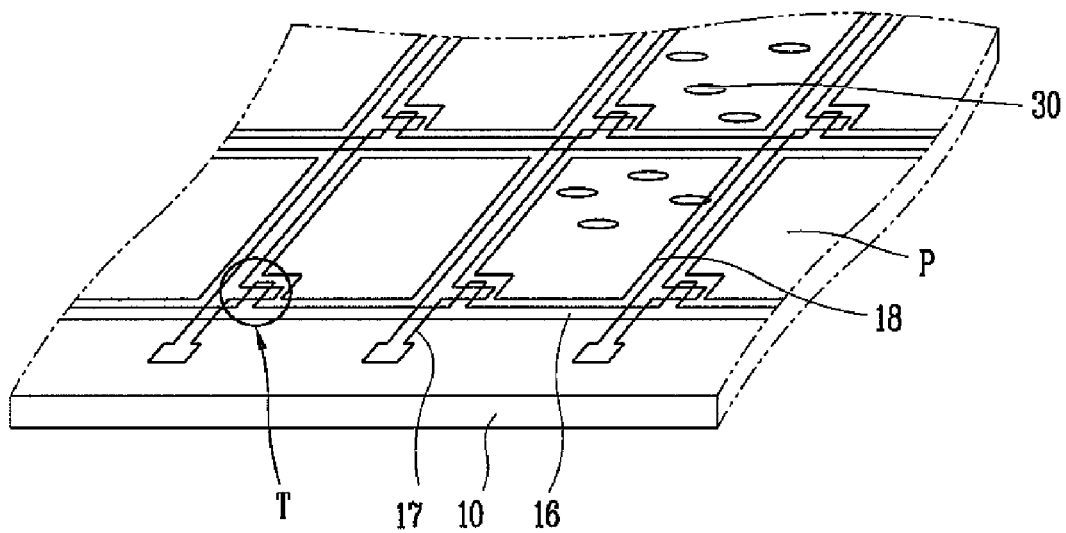
Figure 2A:
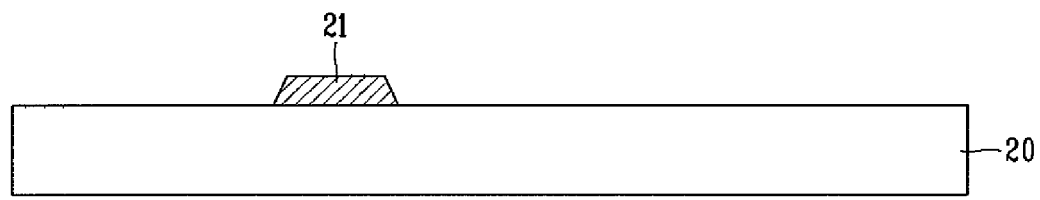
FIGS. 2A to 2E are sectional views sequentially showing a fabrication process of an array substrate of the LCD in FIG. 1.
Figure 2B:
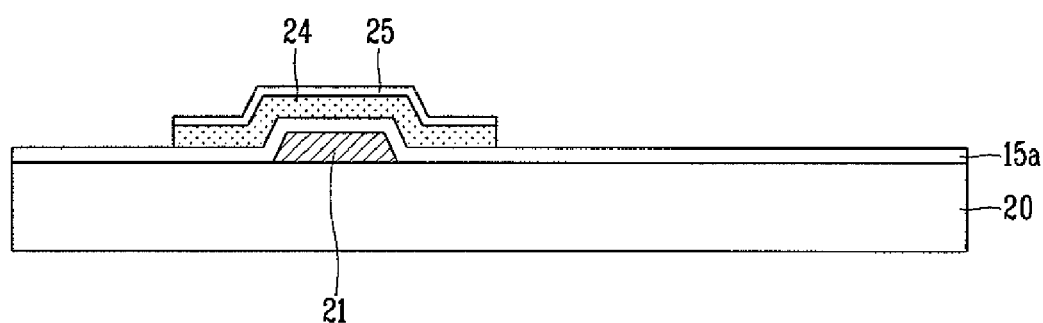
Figure 2C:
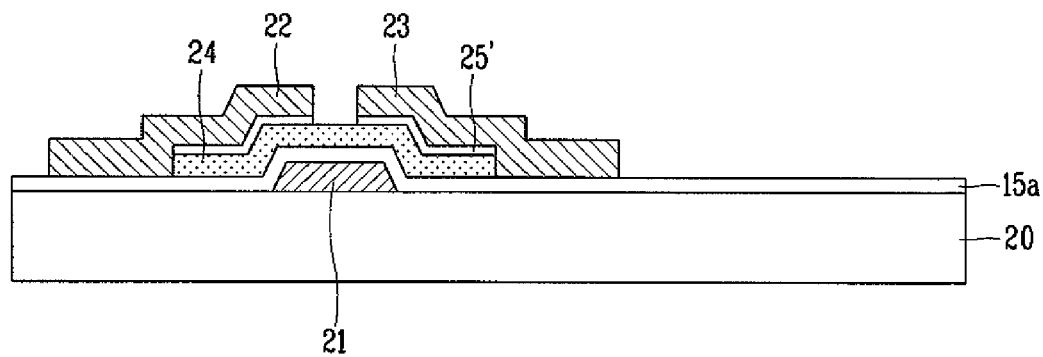
Figure 2D:
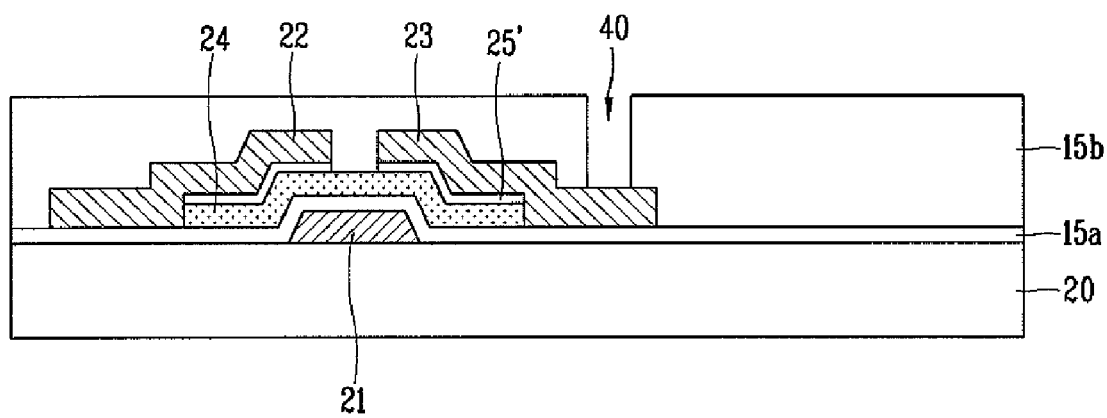
Figure 2E:
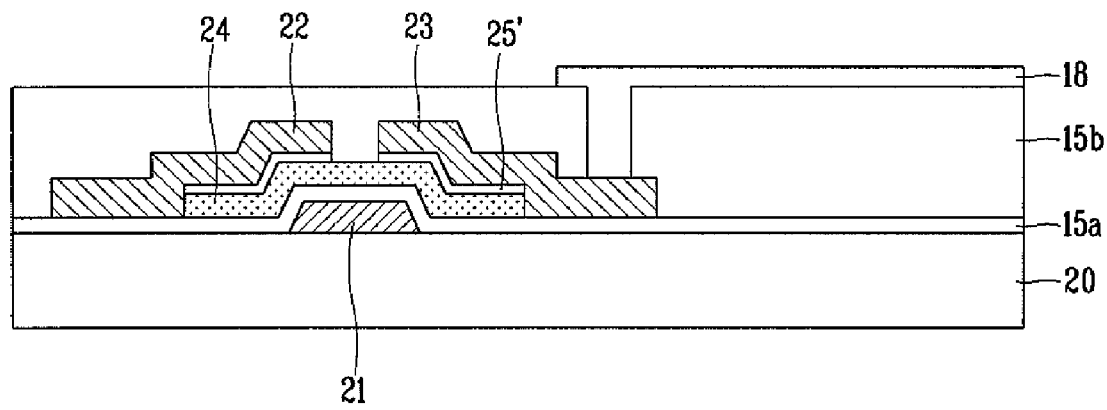
Figure 3:
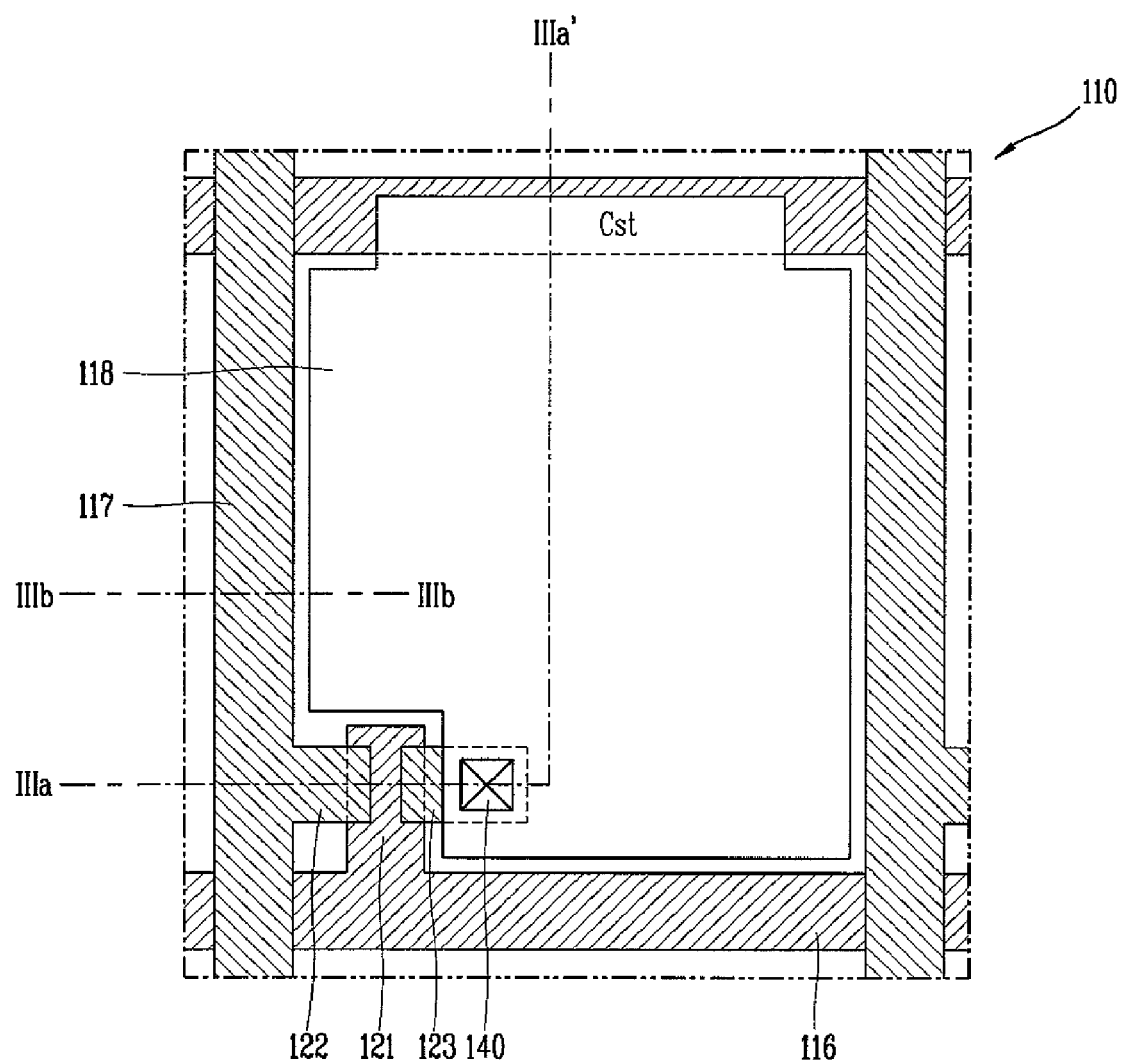
FIG. 3 is a plan view showing a portion of an array substrate of an LCD according to a first exemplary embodiment of the present invention.

FIG. 3 is a plan view showing a portion of an array substrate of an LCD according to a first exemplary embodiment of the present invention, in which a single pixel including a gate pad part and a data pad part are shown for the sake of explanation. The N number of gate lines and M number of data lines are formed to cross each other to define the M×N number of pixels, and in order to simplify the explanation, only a single pixel is shown.

As shown in FIG. 3, gate lines 116 and the data lines 117 are formed to be arranged vertically and horizontally to define the pixel region on an array substrate 110. A thin film transistor (TFT), a switching element, is formed at a crossing of the gate line 116 and the data line 117. A pixel electrode 118, formed within the pixel region, is connected with the TFT to drive liquid crystal (not shown) together with a common electrode of a color filter substrate (not shown).

The TFT includes a gate electrode 121 connected with the gate line 116, a source electrode 122 connected with the data line 117, and a drain electrode 123 connected with the pixel electrode 118. The TFT also includes an active pattern (not shown) for forming a conductive channel between the source electrode 122 and drain electrode 123 by a gate voltage supplied to the gate electrode 121.

A portion of the source electrode 122 extends in one direction to form a portion of the data line 117, and a portion of the drain electrode 123 extends toward the pixel region and electrically connects with the pixel electrode 118 via the contact hole 140 formed at a second insulating layer (not shown).

A portion of the previous gate line 116 overlaps with a portion of the pixel electrode 118 with a first insulating layer (not shown) and the second insulating layer interposed therebetween to form a storage capacitor Cst. The storage capacitor Cst serves to uniformly maintain voltage applied to a liquid crystal capacitor until a next signal is received. Namely, the pixel electrode 118 of the array substrate 110 forms the liquid crystal capacitor together with the common electrode of the color filter substrate, and in general, voltage applied to the liquid crystal capacitor is not maintained until the next signal is received, but instead is leaked. Thus, in order to uniformly maintain the applied voltage, the storage capacitor Cst should be connected with the liquid crystal capacitor. Besides maintaining the signal, the storage capacitor also may have the effects of stabilizing a gray scale display, reducing flickering effects, reducing the formation of residual images, and the like.

In the LCD according to the exemplary embodiment, the active pattern and the data wirings (i.e., the source and drain electrodes and data lines) are formed through a single masking process by using a half-tone mask or a slit mask (diffraction mask), so the array substrate can be fabricated by a total of four masking processes (the half-tone mask also will include the slit mask, hereinafter). Because the data wirings need to restrain signal delay or disconnection as a means for transferring data signals, they are made of a low-resistance conductive material such as copper. In the LCD according to the exemplary embodiment, in order to prevent copper from diffusing to a lower layer, a diffusion preventing layer is formed at a lower portion of the data wirings with a barrier metal. This will now be described in detail through a LCD fabrication method.

FIGS. 4A to 4D are sectional views sequentially showing a fabrication process taken along lines IIIa'-IIIa', IIIb-IIIb', and IIIc-IIIc' of the array substrate in FIG. 3, i.e., sequentially showing a process for fabricating the array substrate of the pixel part including a data line part. FIGS. 5A to 5D are plan views sequentially showing the fabrication process of the array substrate in FIG. 3.

Figure 4A:
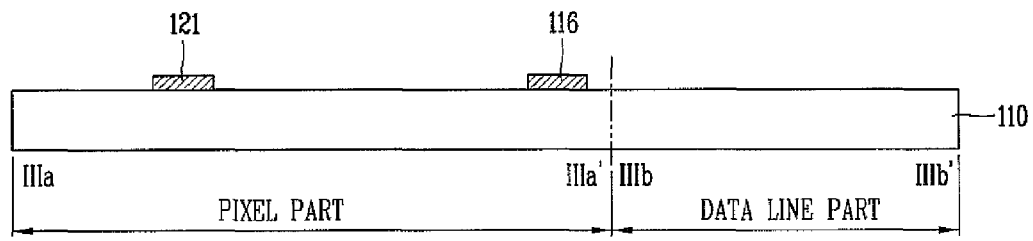
FIGS. 4A to 4D are sectional views sequentially showing a fabrication process taken along lines IIIa-IIIa', IIIb-IIIb' and IIIc-IIic' of the array substrate in FIG. 3.
Figure 5A:
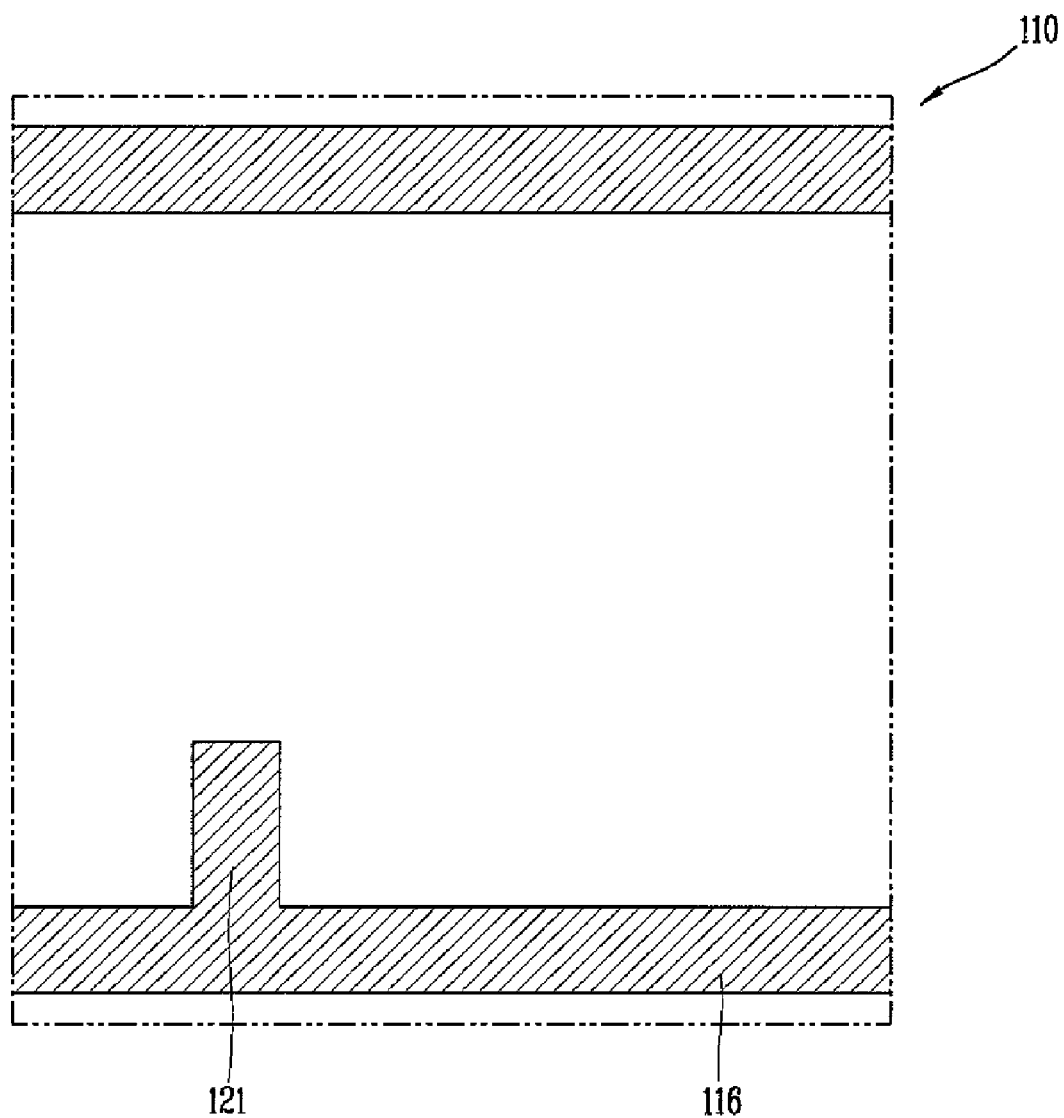
FIGS. 5A to 5D are plan views sequentially showing the fabrication process of the array substrate in FIG. 3.

As shown in FIGS. 4A and 5A, the gate electrode 121 and the gate line 116 are formed at the pixel part of the array substrate 110 made of a transparent insulation material. In this case, the gate electrode 121 and the gate line 116 are formed by depositing a first conductive film on the entire surface of the array substrate 110 and selectively patterning it through the photolithography process (the first masking process). Here, the first conductive film can be made of a low-resistance opaque conductive material such as aluminum (Al), an aluminum alloy, tungsten (W), copper (Cu), chromium (Cr) and molybdenum (Mo), or the like. Also, the first conductive film can be formed to have a multi-layered structure by stacking two or more low-resistance conductive materials.

Figure 4B:
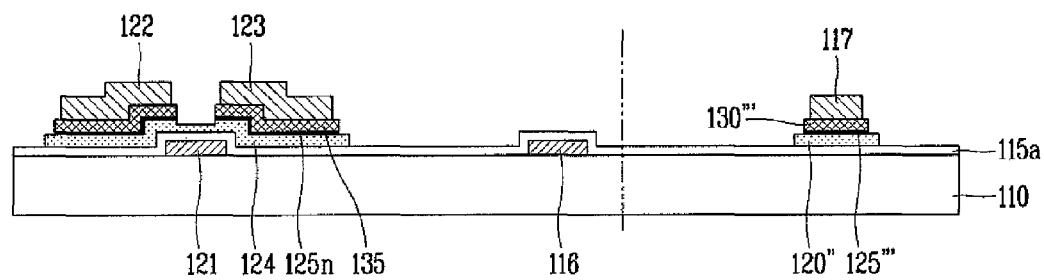
Figure 5B:
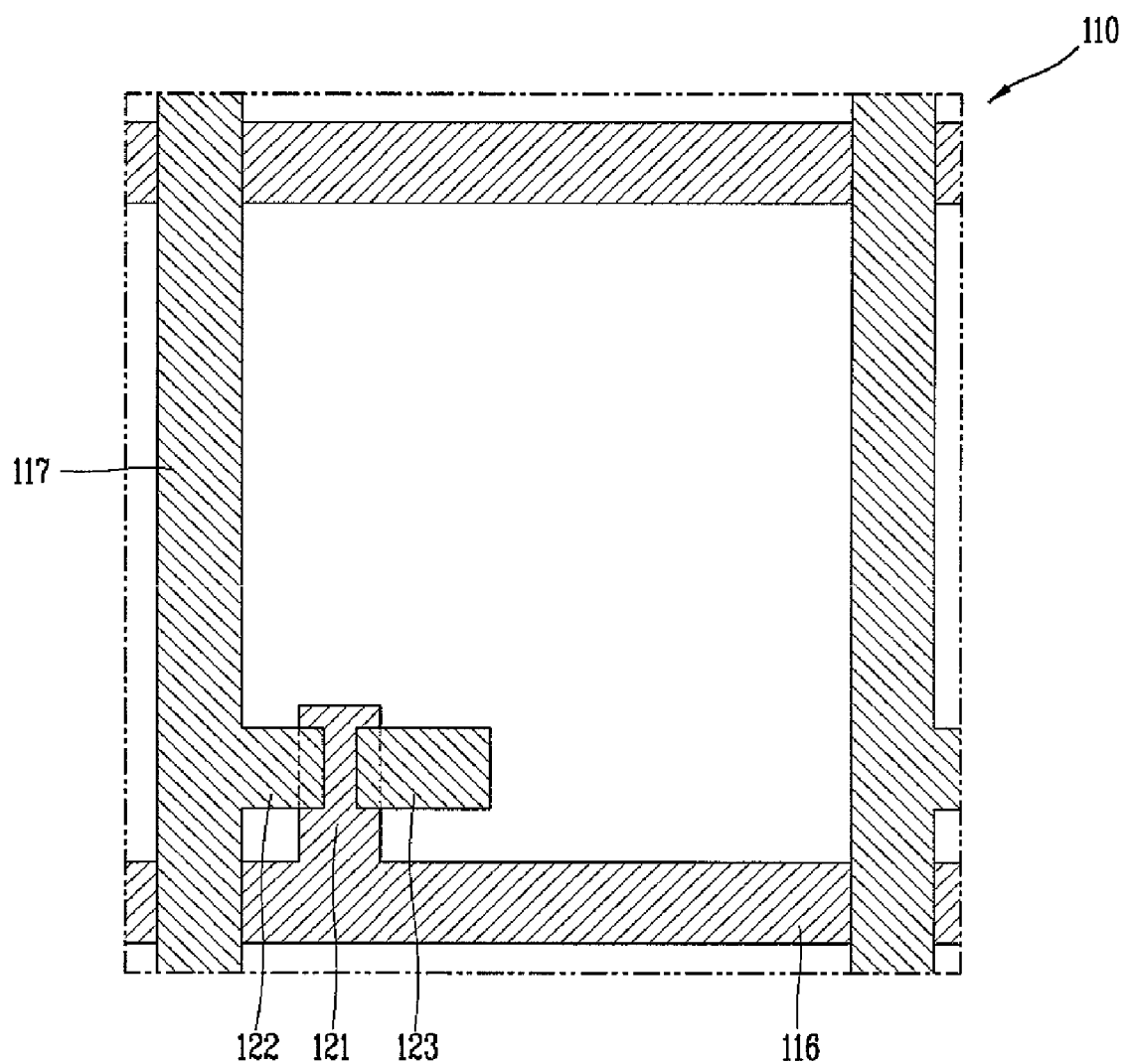

Next, as shown in FIGS. 4B and 5B, a first insulating layer 115a, an amorphous silicon thin film, an n+ amorphous silicon thin film, a barrier metal, and a second conductive film are formed on the entire surface of the array substrate 110 with the gate electrode 121 and the gate line 116 formed thereon and then selectively removed through a photolithography process (a second masking process) to form an active pattern 124 formed of the amorphous silicon thin film and the source and drain electrodes 122 and 123 electrically connected with source and drain electrodes of the active pattern 124 at the pixel part of the array substrate 110. In addition, the data line 117 formed of the second conductive film is formed at the data line part of the array substrate 110 by using the second masking process.

At this time, as shown in FIG. 4B, an ohmic-contact layer 125n and a diffusion preventing layer 135 made of the n+ amorphous silicon thin film and the barrier metal are formed at the upper portion of the active pattern 124. In this case, if the data wirings are made of a low-resistance conductive material such as copper, the diffusion preventing layer 135 can prevent copper from diffusing to a lower layer.

In addition, as shown in FIG. 4B, under the data line 117, there are formed a second amorphous silicon thin film pattern 120'', a third n+ amorphous silicon thin film pattern 125''', and a third pattern 130''', each formed of the amorphous silicon thin film, the n+ amorphous silicon thin film, and the barrier metal.

Figure 4C:
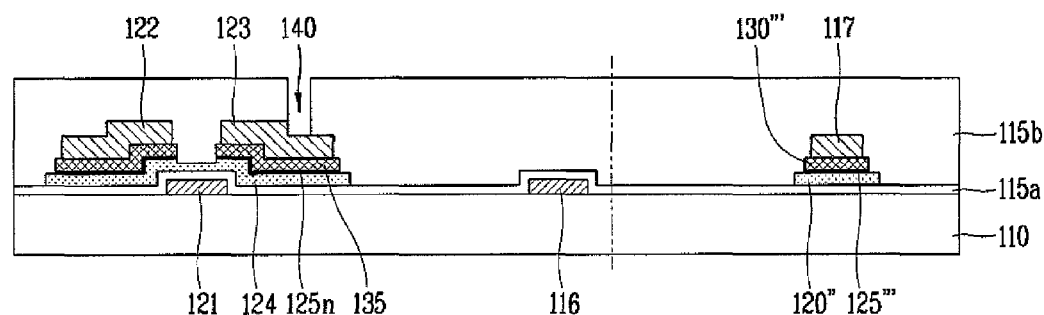
Figure 5C:
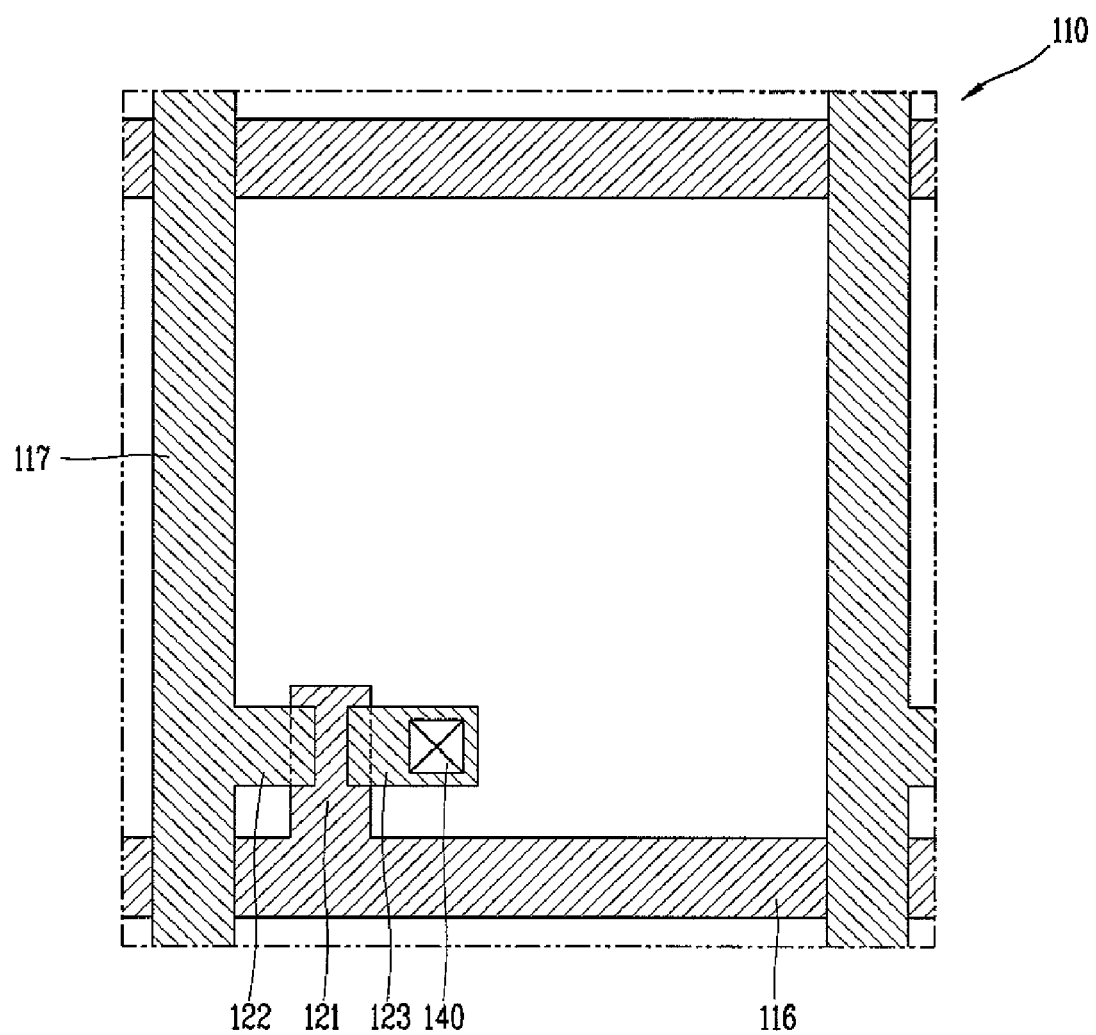

Thereafter, as shown in FIGS. 4C and 5C, a second insulating layer 115b is deposited on the entire surface of the array substrate 110 with the active pattern 124, the source and drain electrodes 122 and 123, and the data line 117 formed thereon. And then, a portion of the second insulating layer 115b is selectively removed through a photolithography process (a second masking process) to form the contact hole 140 exposing a portion of the drain electrode 123 at the pixel part of the array substrate 110.

Figure 4D:
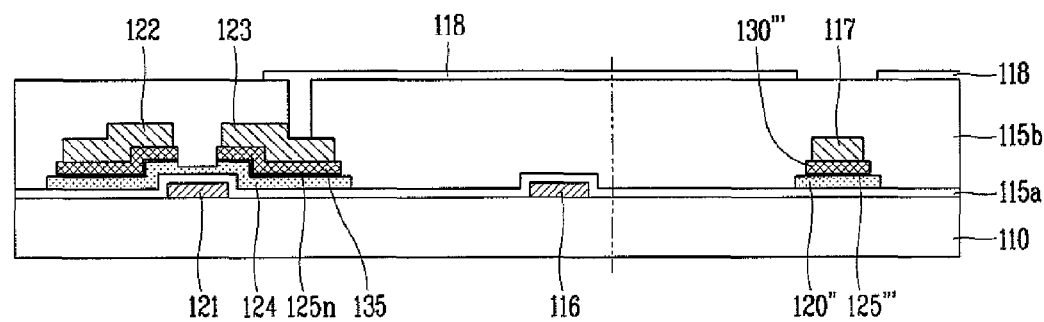
Figure 5D:
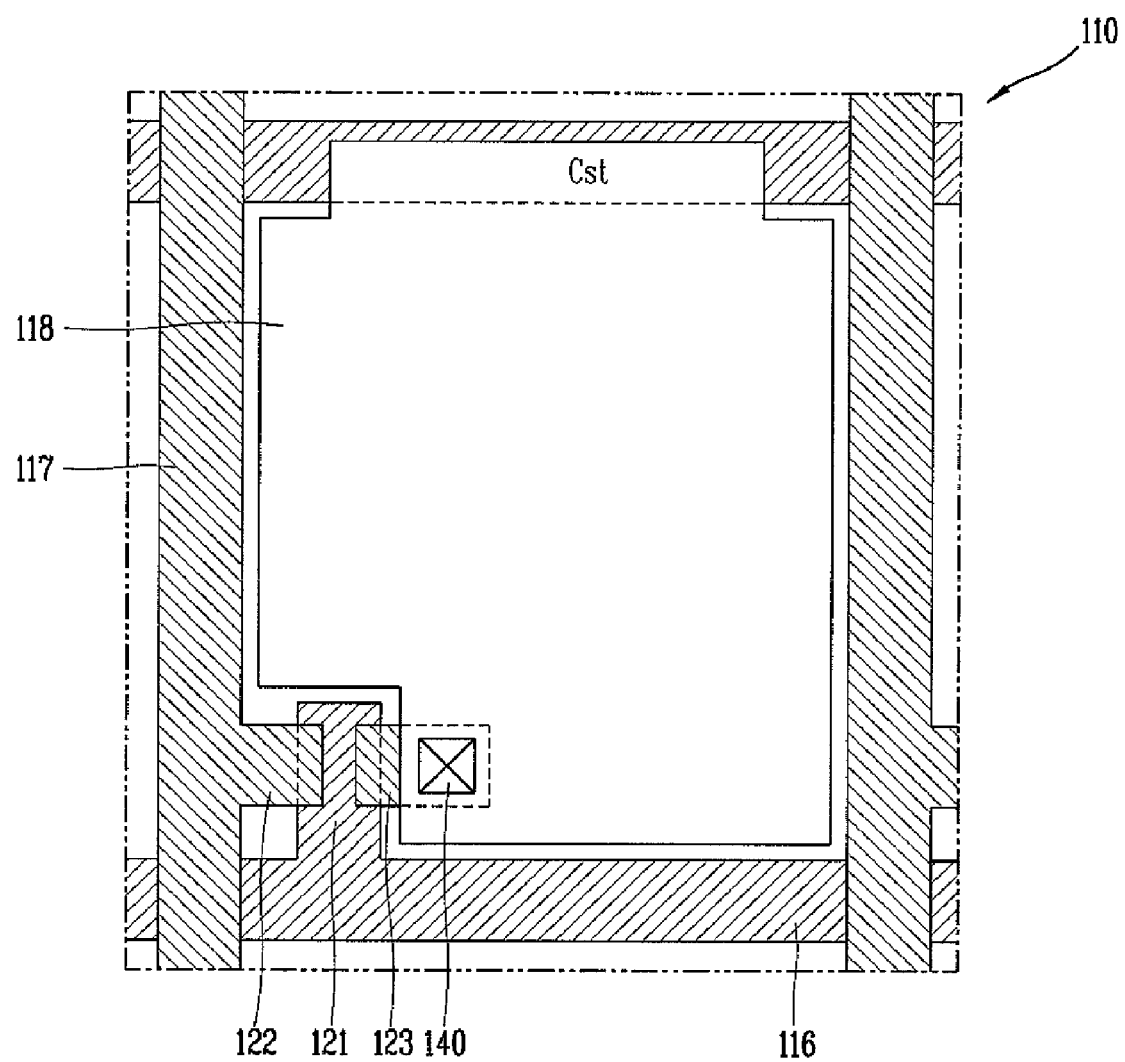

Subsequently, as shown in FIGS. 4D and 5D, a third conductive film is formed on the entire surface of the array substrate 110 and then selectively removed by using a photolithography process (a fourth masking process) to form the pixel electrode 118 electrically connected with the drain electrode 123 via the contact hole 140.

The active pattern 124, the source and drain electrodes 122 and 123, and the data line 117 are simultaneously formed through a single masking process (the second masking process) by using the half-tone mask. The second masking process will now be described in detail with reference to the accompanying drawings.

FIGS. 6A to 6H are sectional views of the array substrate in FIG. 4B showing the second masking process according to a first exemplary embodiment of the present invention.

Figure 6A:
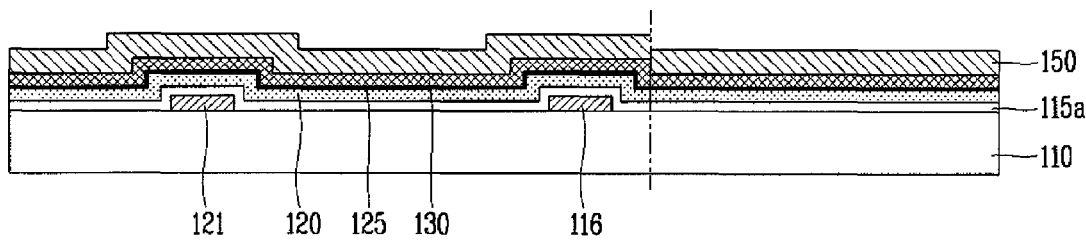
FIGS. 6A to 6H are sectional views of the array substrate in FIG. 4B showing a second masking process according to a first exemplary embodiment of the present invention.

As shown in FIG. 6A, on the entire surface of the array substrate 110 with the gate electrode 121 and the gate line 116 formed thereon, are formed the first insulating layer 115a, the amorphous silicon thin film 120, the n+ amorphous silicon thin film 125, the barrier metal 130, and the second conductive film 150. In the first exemplary embodiment, the second conductive film is made of copper, which is a low-resistance conductive material, to form the data wirings, i.e., the source electrode, the drain electrode and the data line. In order to prevent copper from diffusing to the n+ amorphous silicon thin film 125, the lower layer, the barrier metal 130, such as MoTi, is formed with a thickness of about 100 Å to 500 Å below the second conductive film 150.

Figure 6B:
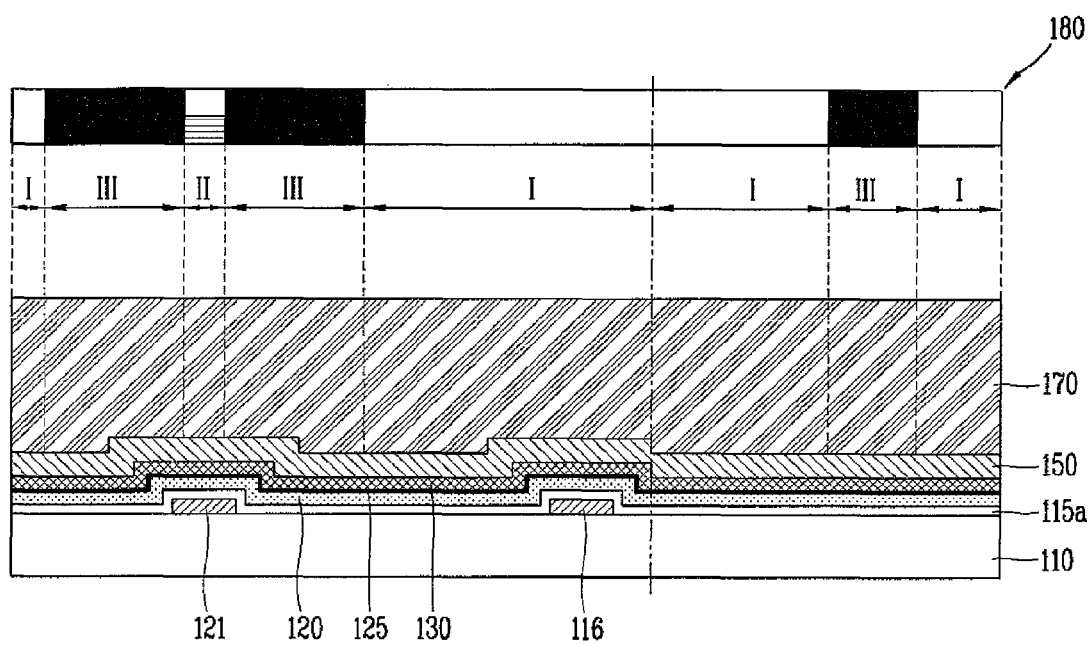

Thereafter, as shown in FIG. 6B, a photosensitive film 170 made of a photosensitive material such as photoresist is formed on the entire surface of the array substrate 110, on which light is selectively irradiated through the half-tone mask 180. The half-tone mask 180 includes a first transmission region (I) that allows irradiated light to be entirely transmitted therethrough, a second transmission region (II) that allows only some light to be transmitted therethrough while blocking the remaining light, and a blocking region (III) that entirely blocks the irradiated light. Only light which has transmitted through the half-tone mask 180 can be irradiated on the photosensitive film 170.

Figure 6C:
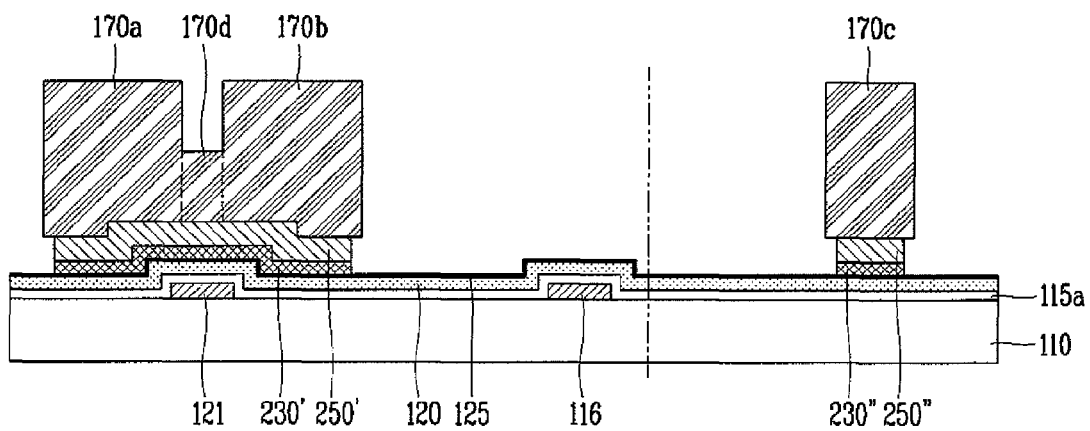

Subsequently, when the photosensitive film 170 that has been exposed through the half-tone mask 180 is developed, as shown in FIG. 6C, first to fourth photosensitive film patterns 170a to 170d remain at regions where light has been entirely blocked or partially blocked through the blocking region (III) and the second transmission region (II), and the photosensitive film at the transmission region (I) through which light had been entirely transmitted has been completely removed to expose the surface of the second conductive film 150.

At this time, the first to third photosensitive film patterns 170a to 170c formed at the blocking region III are thicker than the fourth photosensitive film pattern 170d formed through the second transmission region II. In addition, the photosensitive film at the region where the light had entirely transmitted through the first transmission region I has been completely removed. This is because positive photoresist has been used. However, the present invention is not limited thereto, as negative photoresist also can be used.

Subsequently, the lower barrier metal and the second conductive film are selectively removed by using the first to fourth photosensitive film patterns 170a to 170d as masks to form the first pattern 230' and the first conductive film pattern 250' formed of the barrier metal and the second conductive film at the pixel part of the array substrate 110. In addition, a second pattern 230" and a second conductive film pattern 250" formed of the barrier metal and the second conductive film are formed at the data line part of the array substrate 110. In this case, the barrier metal and the second conductive film are selectively removed through wet etching using a dip etching method or a spray method. If the wet etching is performed, the barrier metal and the second conductive film are isotropically etched, i.e., over-etched, to have a width smaller than those of the upper first to fourth photosensitive film patterns 170a to 170d.

Figure 6D:
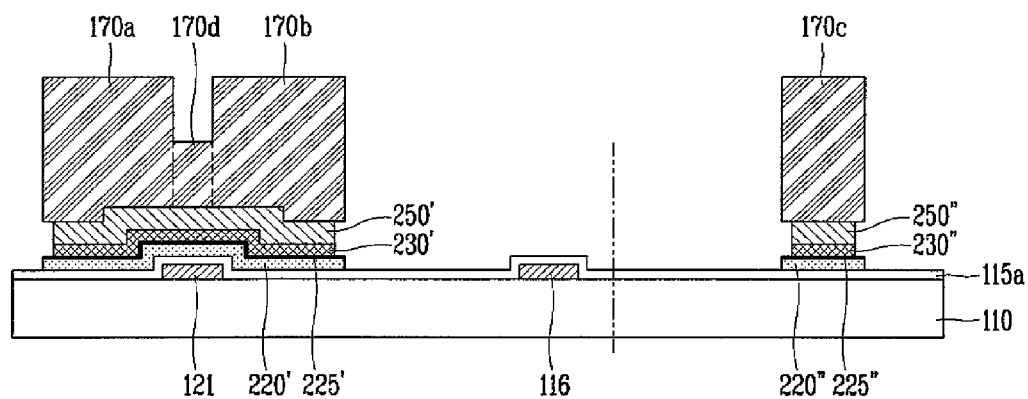

Subsequently, the lower amorphous silicon thin film and the n+ amorphous silicon thin film are selectively removed by using the first to fourth photosensitive film patterns 170a to 170d as masks to form a first amorphous silicon thin film pattern 220' and a first n+ amorphous silicon thin film pattern 225' formed of the amorphous silicon thin film and the n+ amorphous silicon thin film at the pixel part of the array substrate 110, as shown in FIG. 6D. In addition, a second amorphous silicon thin film pattern 220" and a second amorphous silicon thin film pattern 225" formed of the amorphous silicon thin film and the n+ amorphous silicon thin film are formed at the data line part of the array substrate 110. In this case, the amorphous silicon thin film and the n+ amorphous silicon thin film are selectively removed through dry etching using an etching gas, and accordingly, the first amorphous silicon thin film pattern 220', the first n+ amorphous silicon thin film pattern 225', the second amorphous silicon thin film pattern 220", and the second n+ amorphous silicon thin film pattern 225" are patterned in the same form as the first, second, and fourth photosensitive film patterns 170a, 170b, and 170d. Thereafter, an ashing process is performed to remove portions of the first to fourth photosensitive film patterns 170a to 170d.

Figure 6E:
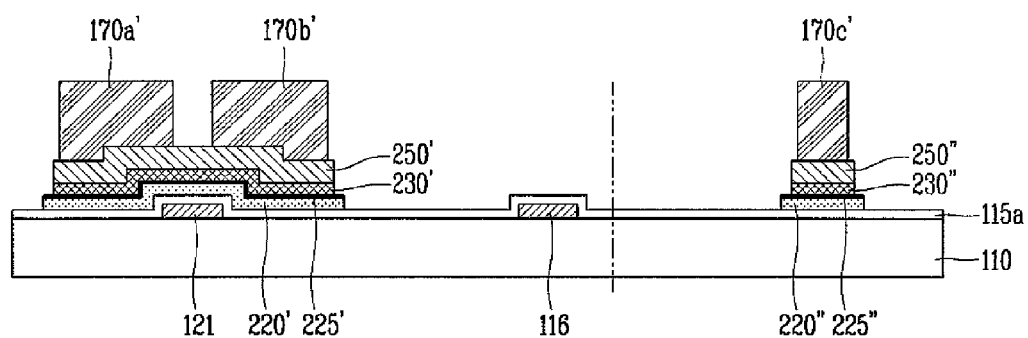

Then, as shown in FIG. 6E, the fourth photosensitive film pattern at the second transmission region II is completely removed. In this case, the first to third photosensitive film patterns respectively remain as fifth photosensitive film pattern 170a' to seventh photosensitive film pattern 170c' with a thickness obtained by removing the thickness of the fourth photosensitive film pattern only on the source electrode region, the drain electrode region, and the data line region corresponding to the blocking region (III).

Figure 6F:
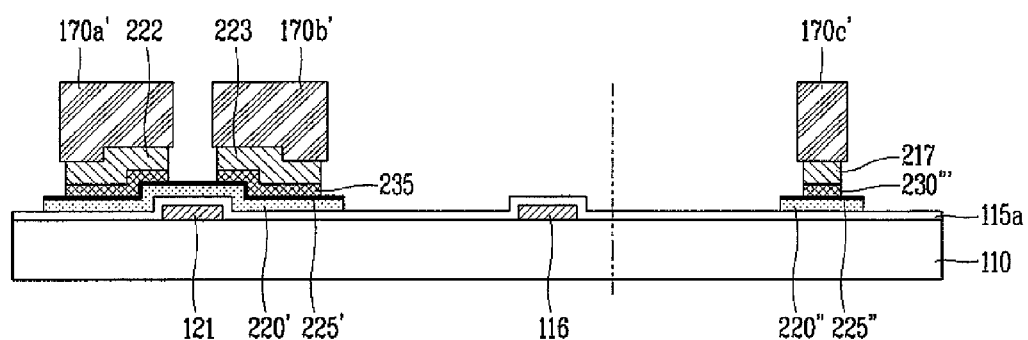

Thereafter, as shown in FIG. 6F, the first pattern 230', the second pattern 230", the first conductive film pattern 250', and the second conductive film pattern 250" are selectively removed through wet etching by using the remaining fifth to seventh photosensitive film patterns 170a' to 170c' as masks to form a source electrode 222 and a drain electrode 223 formed of the second conductive film and a diffusion preventing layer 235 formed of the barrier metal at the pixel part of the array substrate 110. In addition, a data line 217 formed of the second conductive film and a third pattern 230''' formed of the barrier metal are formed at the data line part of the array substrate 110. The diffusion preventing layer 235 serves to prevent copper constituting the source electrode 222 and the drain electrode 223 from diffusing into the lower n+ amorphous silicon thin film. The source and drain electrodes 222 and 223, the diffusion preventing layer 235, the data line 217, and the third pattern 230''' are over-etched with a width smaller than the upper fifth to seventh photosensitive film patterns 170a' to 170c' because the wet etching is performed.

Figure 6G:
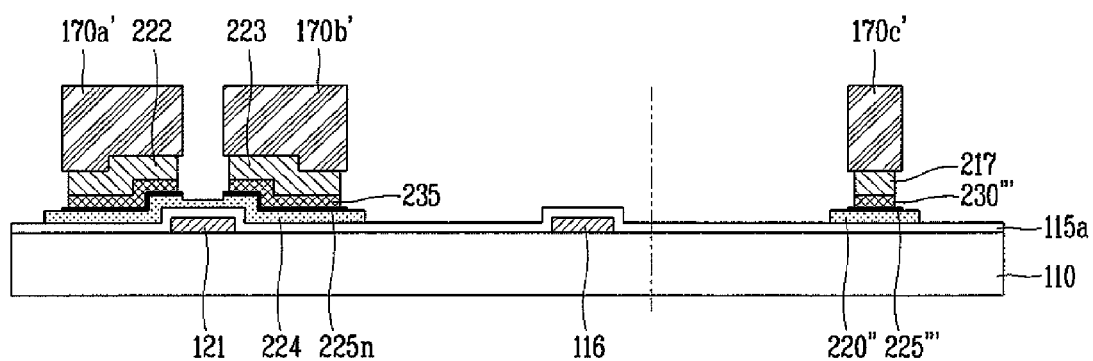
Figure 6H:
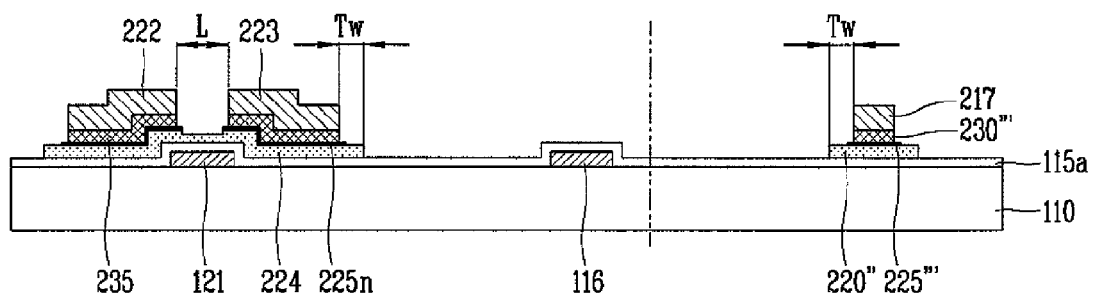

Subsequently, an upper surface of the lower first amorphous silicon thin film pattern and the first and second n+ amorphous silicon thin film patterns are selectively removed by using the fifth to seventh photosensitive film patterns 170a' to 170c' as masks to form an active pattern 224 formed of the amorphous silicon thin film at the pixel part of the array substrate 110 as shown in FIGS. 6G and 6H.

At this time, an ohmic-contact layer 225n formed of the n+ amorphous silicon thin film is formed at an upper portion of the active pattern 224 and allows the source and drain regions of the active pattern 224 and the source and drain electrodes 222 and 223 to ohmic-contact with each other. In addition, a third n+ amorphous silicon thin film 225''' formed of the n+ amorphous silicon thin film is formed at the data line part of the array substrate 110. In this case, the first n+ amorphous silicon thin film pattern and the second n+ amorphous silicon thin film pattern are selectively removed through dry etching, and accordingly, the ohmic-contact layer 225n and the third n+ amorphous silicon thin film pattern 225''' are patterned in the substantially same form as the fifth to seventh photosensitive film patterns 170a' to 170c'.

Here, in the first embodiment, the second conductive film and the barrier metal for data wirings are all etched through wet etching. In this case, because there is a considerable difference in etch rate between copper and MoTi, the overall wet etching process time and channel length (L) are increased. Namely, MoTi has an etch rate lower by 10 times than copper, so the etching process time is increased due to MoTi to increase the wet etching bias, making it difficult to implement a fine channel.

Through the wet etching process performed twice, the side of the active pattern 224 or the second n+ amorphous silicon thin film pattern 220" is protruded by the length Tw compared with the width of the source and drain electrodes 222 and 223 or the data line 217, forming an active tail that generates a wavy noise. In addition, after the channel part is wet-etched, the n+ amorphous silicon thin film is etched through dry etching, so an n+ tail is generated to be protruded compared with the source and drain electrodes 222 and 223, making the definition of the channel length (L) ambiguous.

Thus, in a second embodiment, the barrier metal having a lower wet etch rate than that of copper is etched through dry etching to thus shorten the etching process time and a fine channel can be implemented by forming a metal tip. The second masking process of the second embodiment will now be described in detail with reference to the accompanying drawings.

FIGS. 7A to 7H are sectional views of the array substrate in FIG. 4B showing a second masking process according to a second exemplary embodiment of the present invention, in which the substantially same process as the second masking process according to the first embodiment of the present invention is performed, except for the etching process of the barrier metal.

Figure 7A:
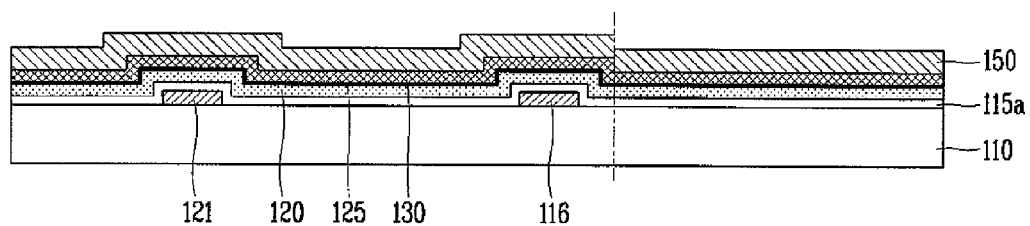
FIGS. 7A to 7H are sectional views of the array substrate in FIG. 4B showing a second masking process according to a second exemplary embodiment of the present invention.

As shown in FIG. 7A, a first insulating layer 115a, an amorphous silicon thin film 120, an n+ amorphous silicon thin film 125, a barrier metal 130, and a second conductive film 150 are formed on the entire surface of the array substrate 110 with the gate electrode 121 and the gate line 116 formed thereon. In the second exemplary embodiment, the second conductive film is made of copper, a low-resistance conductive material, to form the data wirings, i.e., the source electrode, the drain electrode, and the data line. In this case, in order to prevent copper from diffusion to the n+ amorphous silicon thin film 125, the lower layer, the barrier metal 130 such as MoTi is formed with a thickness of about 100 Å to 500 Å below the second conductive film 150.

Figure 7B:
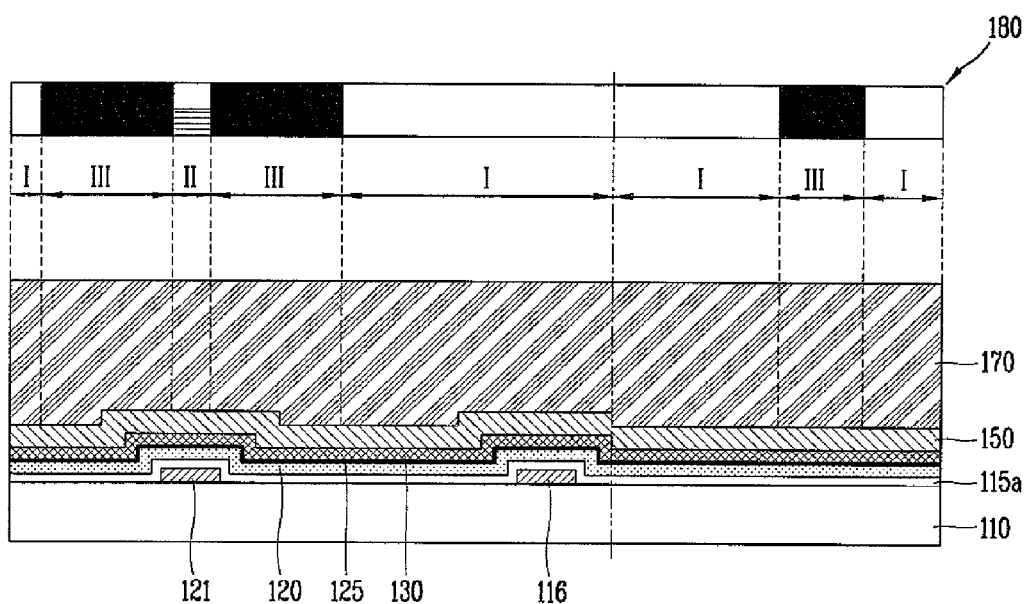

Thereafter, as shown in FIG. 7B, a photosensitive film 170 made of a photosensitive material such as photoresist is formed on the entire surface of the array substrate 110, on which light is selectively irradiated through the half-tone mask 180.

Figure 7C:
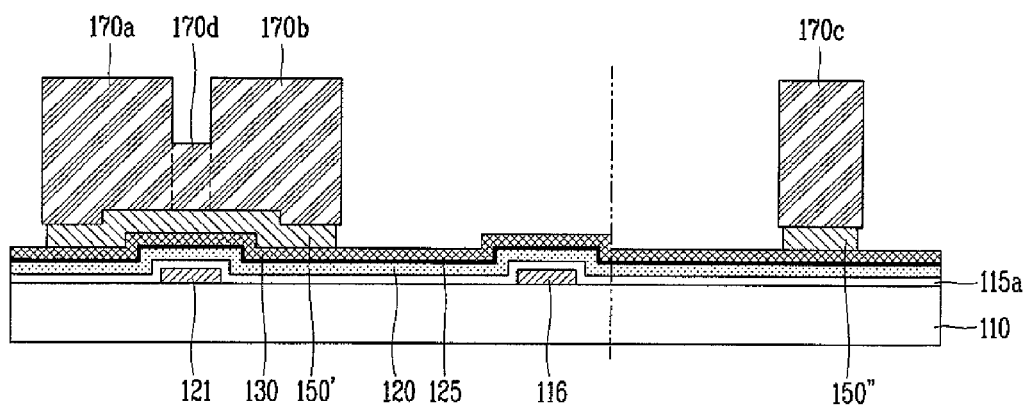

Subsequently, when the photosensitive film 170, which has been exposed through the half-tone mask 180, is developed, as shown in FIG. 7C, first to fourth photosensitive film patterns 170a to 170d remain at regions where light has been entirely blocked or partially blocked through the blocking region (III) and the second transmission region (II), and the photosensitive film at the transmission region (I) through which light had been entirely transmitted has been completely removed to expose the surface of the second conductive film 150. Subsequently, the lower second conductive film is selectively removed by using the first to fourth photosensitive film patterns 170a to 170d as masks to form a first conductive film pattern 150' formed of the second conductive film at the pixel part of the array substrate 110, and a second conductive film pattern 150" formed of the second conductive film at the data line part of the array substrate 110.

At this time, the second conductive film is isotropically etched, namely, over-etched, to have a width smaller than the upper first to fourth photosensitive film patterns 170a to 170d.

Figure 7D:
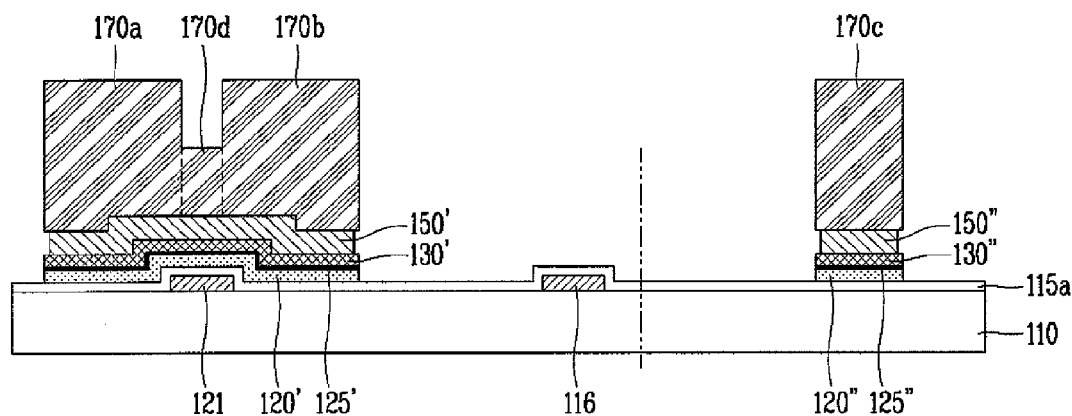

Subsequently, the lower amorphous silicon thin film, the n+ amorphous silicon thin film, and the barrier metal are selectively removed by using the first to fourth photosensitive film patterns 170a to 170d as masks to form a first amorphous silicon thin film pattern 120', a first n+ amorphous silicon thin film pattern 125', and a first pattern 130' formed of the amorphous silicon thin film, the n+ amorphous silicon thin film, and the barrier metal at the pixel part of the array substrate 110, as shown in FIG. 7D.

In addition, a second amorphous silicon thin film pattern 120", a second amorphous silicon thin film pattern 125", and a second pattern 130" formed of the amorphous silicon thin film, the n+ amorphous silicon thin film, and the barrier metal are formed at the data line part of the array substrate 110. In this case, the amorphous silicon thin film, the n+ amorphous silicon thin film, and the barrier metal are selectively removed through dry etching, and accordingly, the first amorphous silicon thin film pattern 120', the first n+ amorphous silicon thin film pattern 125', the first pattern 130, the second amorphous silicon thin film pattern 120", the second n+ amorphous silicon thin film pattern 125", and the second pattern 130" are patterned substantially in the same form as the first, second, and fourth photosensitive film patterns 170a, 170b, and 170d. Thereafter, an ashing process is performed to remove portions of the first to fourth photosensitive film patterns 170a to 170d.

Figure 7E:
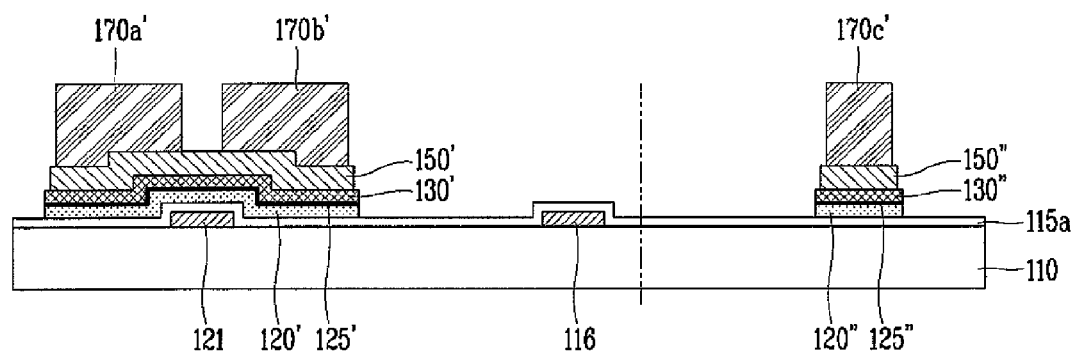

Then, as shown in FIG. 7E, the fourth photosensitive film pattern at the second transmission region II is completely removed. In this case, the first to third photosensitive film patterns respectively remain as fifth photosensitive film pattern 170a' to seventh photosensitive film pattern 170c' with a thickness obtained by removing the thickness of the fourth photosensitive film pattern only on the source electrode region, the drain electrode region, and the data line region corresponding to the blocking region (III).

Figure 7F:
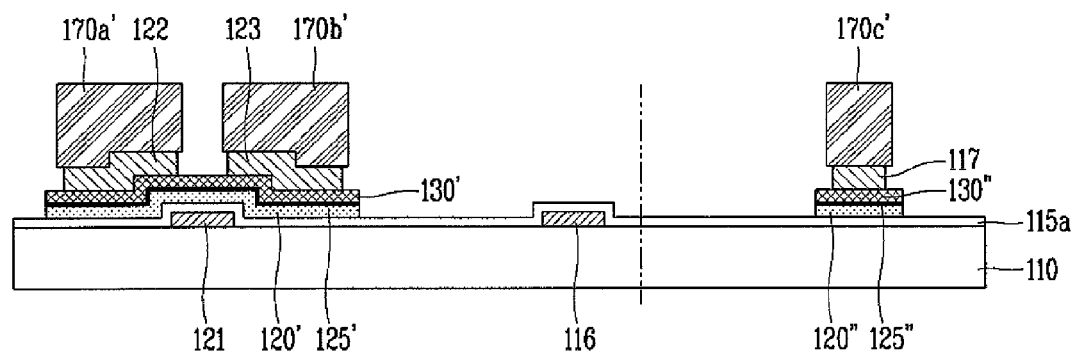

Thereafter, as shown in FIG. 7F, the first conductive film pattern 150' and the second conductive film pattern 150" are selectively removed through wet etching by using the remaining fifth to seventh photosensitive film patterns 170a' to 170c' as masks to form a source electrode 122 and a drain electrode 123 formed of the second conductive film at the pixel part of the array substrate 110 and a data line 117 formed of the second conductive film at the data line part of the array substrate 110. In this case, the source electrode 122, the drain electrode 123, and the data line 117 are etched through wet etching, so they are over-etched with a width smaller than the upper fifth to seventh photosensitive film patterns 170a' to 170c'.

Figure 7G:
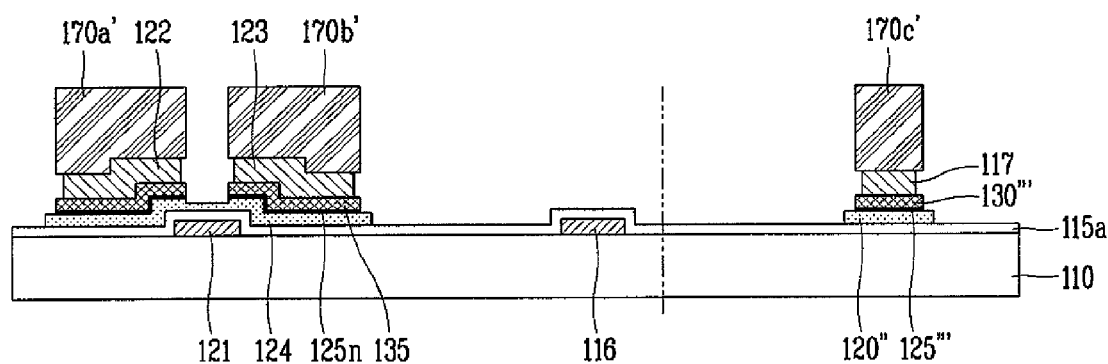
Figure 7H:
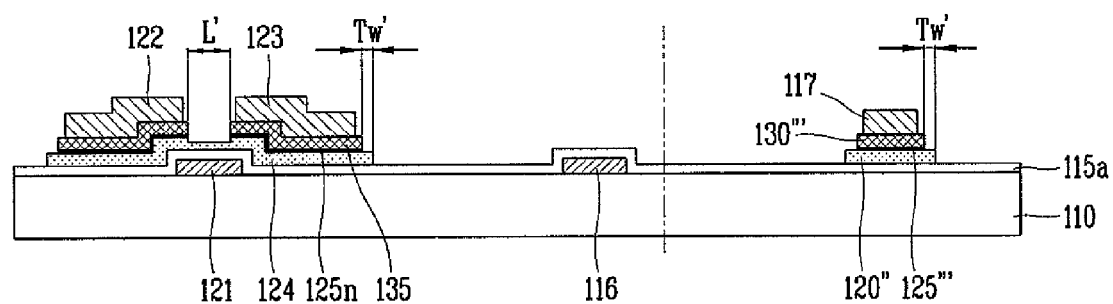

Subsequently, the lower first amorphous silicon thin film pattern, the first and second n+ amorphous silicon thin film patterns, and the first and second patterns are selectively removed by using the fifth to seventh photosensitive film patterns 170a' to 170c' as masks to form an active pattern 124 formed of the amorphous silicon thin film at the pixel part of the array substrate 110, as shown in FIGS. 7G and 7H. At this time, an ohmic-contact layer 125n and a diffusion preventing layer 135 formed of the n+ amorphous silicon thin film and the barrier metal are formed at an upper portion of the active pattern 124. The ohmic-contact layer 125n serves to allow the source and drain regions of the active pattern 124 and the source and drain electrodes 122 and 123 to ohmic-contact with each other, and the diffusion preventing layer 135 serves to prevent copper constituting the source electrode 122 and the drain electrode 123 from diffusion to the lower ohmic-contact layer 125n. In addition, a third n+ amorphous silicon thin film 125'" and a third pattern 130'" formed of the n+ amorphous silicon thin film and the barrier metal are formed at the data line part of the array substrate 110.

In this case, the first n+ amorphous silicon thin film pattern, the first pattern, the second n+ amorphous silicon thin film pattern, and the second pattern are selectively removed through dry etching, and accordingly, the ohmic-contact layer 125n, the diffusion preventing layer 135, the third n+ amorphous silicon thin film pattern 125'", and the third pattern 130'" are patterned in the substantially same form as the fifth to seventh photosensitive film patterns 170a' to 170c'. In this manner, in the second masking process according to the second exemplary embodiment of the present invention, because only the second conductive film is selectively removed by using wet etching, the wet etching process time can be shortened, and accordingly, an etching bias can be reduced. In addition, because the barrier metal is etched by using dry etching, a certain metal tip can be formed to be protruded to an inner side of a channel, whereby the channel length (L') can be substantially reduced by the metal tip and thus a fine channel can be implemented. In addition, because the side of the active pattern 124 or the second n+ amorphous silicon thin film pattern 120" is provided compared with the diffusion preventing layer 135 or the third pattern 130'" because of the metal tip protruded to the side of the data wirings, the width (Tw') of an active tail can be substantially reduced.

FIG. 8 is a table showing data obtained measured by lengths of channels of a thin film transistor formed through the second masking process according to the second exemplary embodiment of the present invention and that formed through a general four-masking process, in which a channel length with respect to an arbitrary point is expressed in μm.

As shown in FIG. 8, channel lengths were measured with respect to 11 points. For thin film transistors (TFTs) in the comparative examples that were formed using four masking processes, the channel lengths ranged from 4.4 μm to 5.5 μm. For the TFTs in the experimental examples that were formed using two masking processes according to the second exemplary embodiment of the present invention, the channel lengths ranged from 2.8 µm to 4.3 µm. In addition, when averaging them, it can be noted that the channel lengths of the TFTs of the experimental examples are shorter by about 1.4 µm than those of the comparative examples.

The array substrates according to the exemplary embodiments of the present invention are attached with color filter substrates in a facing manner by a sealant applied to outer edges of the image display part. In this case, the color filter substrates include black matrixes for preventing leakage of light to the TFTs, the gate lines and the data lines and color filters for implementing red, green and blue colors. The attachment of the color filter substrates and the array substrates are made through attachment keys formed on the color filter substrates or the array substrates.

In the embodiments of the present invention, as the active patterns, the amorphous silicon TFT using the amorphous silicon thin film is used as an example, but the present invention is not limited thereto and as the active patterns, polycrystalline silicon TFTs using a polycrystalline silicon thin film also can be used.

The present invention also can be applied to a different display device fabricated by using TFTs, for example, an OLED (Organic Light Emitting Diode) display device in which OLEDs are connected with driving transistors.

It will be apparent to those skilled in the art that various modifications and variations can be made in the liquid crystal display device and fabrication method thereof of the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display comprising the steps of:
    providing a first substrate;
    forming a gate electrode and a gate line on the first substrate;
    forming a first insulating layer on the first substrate;
    forming an active pattern, an ohmic-contact layer, and a diffusion preventing layer at an upper portion of the gate electrode using dry etching;
    forming source and drain electrodes on the diffusion preventing layer using a wet etching;
    forming a second insulating layer on the first substrate;
    forming a contact hole by removing a portion of the second insulating layer and exposing a portion of the drain electrode;
    forming a pixel electrode electrically connected with the drain electrode via the contact hole; and
    attaching the first and second substrates,
    wherein the diffusion preventing layer includes a metal tip that protrudes beyond the source and drain electrodes.

2. The method according to claim 1, wherein the forming of the active pattern, the source and drain electrodes, and the diffusion preventing layer on the first substrate further comprises the steps of:
    forming a first insulating layer, an amorphous silicon thin film, an n+ amorphous silicon thin film, a barrier metal, and a conductive film on the first substrate;
    forming a first photosensitive film pattern with first and second thicknesses on the first substrate by using a halftone mask;
    selectively removing the conductive film through wet etching by using the first photosensitive film pattern as a mask to form a first conductive film pattern at an upper portion of the gate electrode;
    selectively removing the amorphous silicon thin film, the n+ amorphous silicon thin film and the barrier metal through dry etching by using the first photosensitive film pattern as a mask to form a first amorphous silicon thin film pattern, a first n+ amorphous silicon thin film pattern, and a first pattern formed of the amorphous silicon thin film, the n+ amorphous silicon thin film and the barrier metal at a lower portion of the first conductive film pattern;
    removing a portion of the photosensitive film pattern through an ashing process to form a second photosensitive film pattern with a third thickness;
    selectively removing the first conductive film pattern through wet etching by using the second photosensitive film pattern as a mask to form the source and drain electrodes formed of the conductive film; and
    selectively removing a surface portion of the first amorphous silicon thin film pattern, the first n+ amorphous silicon thin film pattern and the first pattern through dry etching by using the second photosensitive film pattern as a mask to form an active pattern, an ohmic-contact layer, and a diffusion preventing layer formed of the amorphous silicon thin film, the n+ amorphous silicon thin film and the barrier metal.

3. The method according to claim 1 wherein the conductive film is made of a low-resistance conductive material.

4. The method according to claim 3 wherein the low-resistance conductive material is copper.

5. The method according to claim 2 wherein the barrier metal is formed of MoTi.

6. The method according to claim 2 wherein the first conductive film pattern is over-etched with a width smaller than that of the first photosensitive film pattern as wet etching is performed.

7. The method according to claim 2 wherein the first amorphous silicon thin film, the first n+ amorphous silicon thin film pattern, and the first pattern are patterned to have a substantially same form as that of the first photosensitive film pattern as dry etching is used.

8. The according to claim 2 wherein the source and drain electrodes are over-etched with a width smaller than that of the second photosensitive film pattern as wet etching is used.

9. The method according to claim 2 wherein the ohmic-contact layer and the diffusion preventing layer are patterned to have a substantially same form as the second photosensitive film pattern as dry etching is used.

10. The method according to claim 1 wherein the diffusion preventing layer is formed to have a thickness of 100 Å~500 Å.

11. The method according to claim 1 wherein the diffusion preventing layer includes a fine channel by a metal tip protruded in an inward direction of the source and drain electrodes as the diffusion preventing layer is etched through dry etching.

12. A liquid crystal display device comprising:
    a gate electrode and a gate line formed on a first substrate;
    a first insulating layer formed on the first substrate;
    an active pattern, an ohmic-contact layer, and a diffusion preventing layer formed on the gate electrode;
    a data line to cross source and drain electrodes and the gate line formed on the diffusion preventing layer to define a pixel area;
    a second insulating layer formed on the first substrate;

a contact hole formed by removing a portion of the second insulating layer and exposing a portion of the drain electrode;

a pixel electrode electrically connected with the drain electrode via the contact hole; and a second substrate attached with the first substrate in a facing manner, wherein the diffusion preventing layer comprises a metal tip protruded to the side of the source and drain electrodes.

13. The device according to claim 12 wherein the diffusion preventing layer and the ohmic-contact layer have a width larger than that of the source and drain electrodes.

14. The device according to claim 12 wherein the conductive film is made of a low-resistance conductive material.

15. The device according to claim 14 wherein the low-resistance conductive material is copper.

16. The device of claim 12, wherein the diffusion preventing layer is formed to have a thickness of 100 Å~500 Å.

17. The device of claim 12, wherein the metal tip of the diffusion preventing layer protruded in the inward direction of the source and drain electrodes defines a channel length.

* * * * *